United States Patent [19]
Cliff et al.

[11] Patent Number: 5,543,730
[45] Date of Patent: Aug. 6, 1996

[54] TECHNIQUES FOR PROGRAMMING PROGRAMMABLE LOGIC ARRAY DEVICES

[75] Inventors: Richard G. Cliff, Milpitas; Srinivas T. Reddy, Santa Clara; Kerry Veenstra, San Jose; Andreas Papaliolios, Sunnyvale; Chiakang Sung, Milpitas; Richard S. Terrill, Santa Clara; Rina Raman, Fremont; Robert R. N. Bielby, Pleasonton, all of Calif.

[73] Assignee: Altera Corporation, San Jose, Calif.

[21] Appl. No.: 442,801

[22] Filed: May 17, 1995

[51] Int. Cl.⁶ .................................................. H03K 19/177
[52] U.S. Cl. .................................. 326/38; 326/39; 326/41
[58] Field of Search .................................. 326/38–41, 44

[56] References Cited

U.S. PATENT DOCUMENTS

| | | | |
|---|---|---|---|
| Re. 34,363 | 8/1993 | Freeman | 307/465 |
| 3,473,160 | 10/1969 | Wahlstrom | 340/172.5 |
| 4,020,469 | 4/1977 | Manning | 340/172.5 |
| 4,609,986 | 9/1986 | Hartmann et al. | 364/200 |
| 4,617,479 | 10/1986 | Hartmann et al. | 307/465 |
| 4,642,487 | 2/1987 | Carter | 307/465 |
| 4,677,318 | 6/1987 | Veenstra | 307/465 |
| 4,713,492 | 12/1987 | Hartmann et al. | 364/900 |
| 4,758,745 | 7/1988 | Elgamal et al. | 307/465 |
| 4,774,421 | 9/1988 | Hartmann et al. | 307/465 |
| 4,871,930 | 10/1989 | Wong et al. | 307/465 |
| 4,899,067 | 2/1990 | So et al. | 307/465 |
| 4,912,342 | 3/1990 | Wong et al. | 307/465 |
| 5,121,006 | 6/1992 | Pedersen | 307/465 |
| 5,220,214 | 6/1993 | Pedersen | 307/465 |
| 5,237,219 | 8/1993 | Cliff | 307/465 |
| 5,256,918 | 10/1993 | Suzuki | 326/38 |
| 5,260,610 | 11/1993 | Pedersen et al. | 307/465 |
| 5,260,611 | 11/1993 | Cliff et al. | 307/465 |
| 5,350,954 | 9/1994 | Patel | 307/465 |
| 5,371,422 | 12/1994 | Patel et al. | 326/41 |
| 5,426,379 | 6/1995 | Trimberger | 326/39 |
| 5,450,608 | 9/1995 | Steele | 326/38 X |
| 5,457,408 | 10/1995 | Leung | 326/38 |
| 5,469,003 | 11/1995 | Kean | 326/39 |

FOREIGN PATENT DOCUMENTS

| | | | |
|---|---|---|---|
| 1444084 | 6/1972 | United Kingdom | H03K 19/00 |

OTHER PUBLICATIONS

R. C. Minnick, "A Survey of Microcellular Research," Journal of the Association for Computing Machinery, vol. 14, No. 2, pp. 203–241, Apr. 1967.

S. E. Wahlstrom, "Programmable Logic Arrays—Cheaper by the Millions," Electronics, Dec. 11, 1967, pp. 90–95.

*Recent Developments in Switching Theory*, A. Mukhopadhyay, ed., Academic Press, New York, 1971, chapters VI and IX, pp. 299–254 and 369–422.

*Microcomputer Interfacing*, H. S. Stone, Addison–Wesley Publishing Company, Reading, Massachusetts, 1982, pp. 95–98.

*Primary Examiner*—David R. Hudspeth
*Attorney, Agent, or Firm*—Fish & Neave; Robert R. Jackson

[57] ABSTRACT

Programmable logic array devices are programmed from programming devices in networks that facilitate programming any number of such logic devices with programs of any size or complexity. The source of programming data and control may be a microprocessor or one or more serial EPROMs, one EPROM being equipped with a clock circuit. Several parallel data streams may be used to speed up the programming operation. A clock circuit with a programmably variable speed may be provided to facilitate programming logic devices with different speed characteristics. The programming protocol may include an acknowledgement from the logic device(s) to the programming data source after each programming data transmission so that the source can automatically transmit programming data at the speed at which the logic device is able to accept that data.

14 Claims, 10 Drawing Sheets

TECHNIQUES FOR PROGRAMMING PROGRAMMABLE LOGIC ARRAY DEVICES

BACKGROUND OF THE INVENTION

This invention relates to programmable logic array devices, and more particularly to techniques for programming such devices.

Illustrative programmable logic array devices requiring programming are shown in Cliff U.S. Pat. No. 5,237,219 and Cliff et al. U.S. Pat. No. 5,434,514. Typically, such devices are "programmed" in order to set them up to thereafter perform desired logic functions. In other words, the programming determines what logic functions the device will perform. The present invention is particularly of interest in connection with programming programmable logic array devices whose programming memory elements are volatile and reprogrammable. For example, such devices typically require reprogramming each time their power supplies are turned on (from having been off). Such devices may also require reprogramming whenever it is desired to change the logic functions they perform, which may occur during certain normal uses of the devices. Because such programming (or reprogramming) may have to be performed relatively frequently, and because the logic devices are generally not usable during programming, it is important to have rapid and efficient programming techniques.

Programmable logic array devices are often designed to be "general purpose" devices. In other words, the programmable logic device is made without any particular end use in mind. It is intended that the customer will use the number of such devices that is appropriate to the customer's application, and that the customer will program those devices in the manner required to enable them to pegform the logic required in the customer's application. Because the size and complexity of various customer applications may vary considerably, it would be desirable to have programming techniques that are modular and lend themselves to programming different numbers of devices with programs of different sizes.

In view of the foregoing, it is an object of this invention to provide improved techniques for programming programmable logic array devices.

It is another object of this invention to provide more rapid techniques for programming programmable logic array devices.

It is still another object of this invention to provide programmable logic array device programming techniques which lend themselves to programming any number of such devices with programs of any size or complexity.

SUMMARY OF THE INVENTION

These and other objects of the invention are accomplished in accordance with the principles of the invention by providing programmable logic array devices which can be programmed one after another in any number from programming devices such as serial erasable programmable read only memories ("serial EPROMs"). Any number of such programming devices can be connected to operate serially. Thus any number of logic devices can be programmed from any number of programming devices, making the programming technique highly modular and capable of performing programming tasks of any size and complexity. The logic devices may be equipped with programming register configurations that allow the logic device to receive several programming data streams in parallel, thereby speeding up the transfer of programming data from the programming device(s) to the logic device(s). A programming device may be equipped with a clock signal generating circuit whose operating speed is programmably variable, thereby enabling the programming device(s) to be used to program logic device(s) having different clock rate requirements. Various communications protocols may be used between the programming devices and the logic devices.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
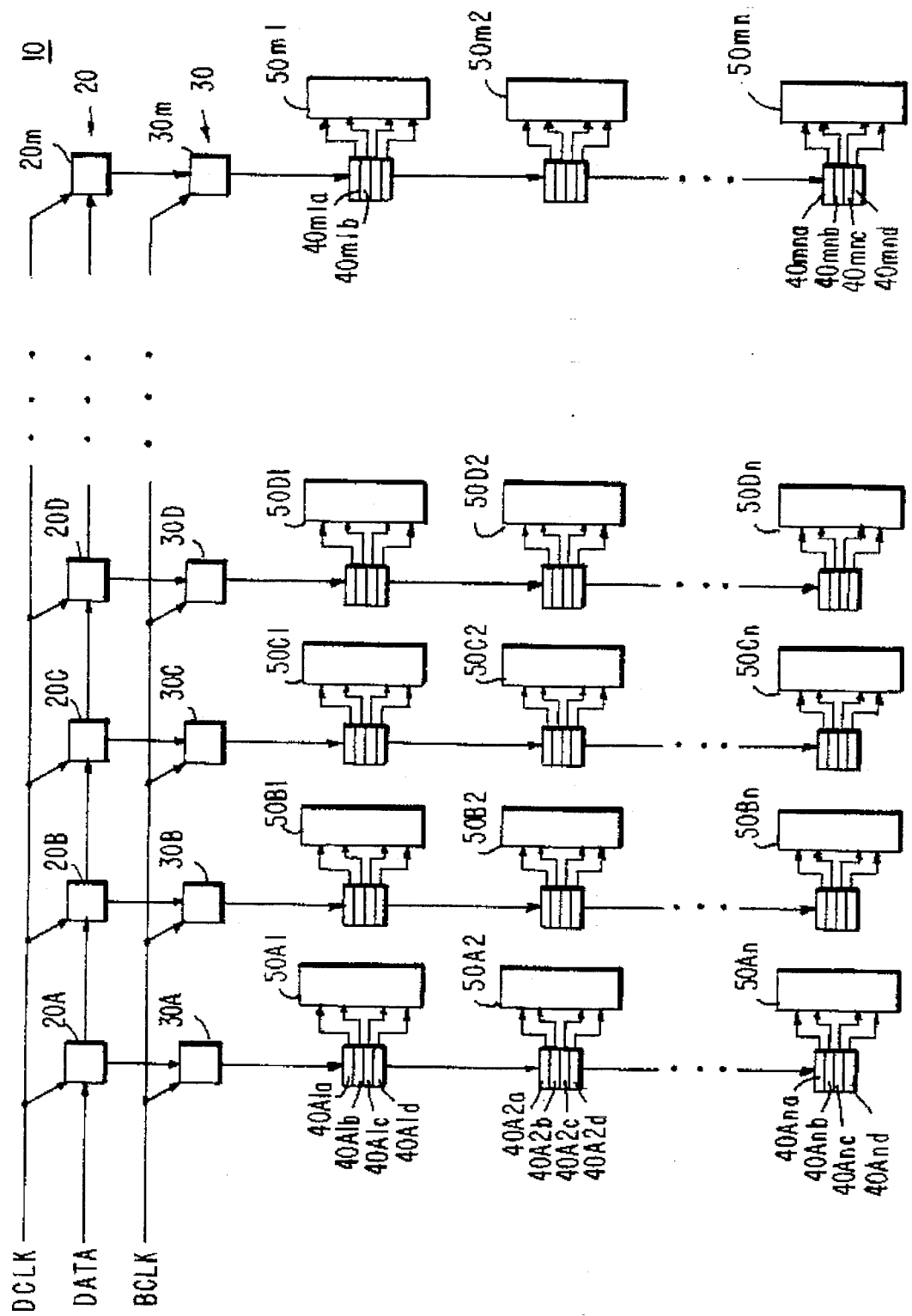
FIG. 1 is a simplified schematic block diagram of portions of an illustrative programmable logic array device requiring programming in accordance with this invention.

Although the invention is equally applicable to programming other types of programmable logic array devices, the invention will be fully understood from the following explanation of its application to programming programmable logic array devices of the general type shown in FIG. 1 (which depicts a structure like that shown in Cliff et al. U.S. Pat. No. 5,434,514, both of which are incorporated by reference herein). Programmable logic array device 10, which is preferably a single integrated circuit, includes a shift register 20 having a plurality of serially connected shift register stages 20A–20m. (The letter "m" is used in FIG. 1 as a general index limit which can have any desired value.) Programming data supplied to device 10 via lead DATA from an external programming data source is shifted into shift register 20 from left to right as viewed in FIG. 1 by clock pulses applied to lead DCLK. In accordance with the present invention, the DCLK pulses also come from a source external to device 10. When register 20 is fully loaded, a signal supplied to the BCLK lead loads all the stages 30A–30m of register 30 in parallel from register 20. The BCLK signal may be generated by device 10 itself based on counting the DCLK pulses and producing a BCLK pulse after each m DCLK pulses have been received. A count of m DCLK pulses indicates that register 20 is full and ready to be dumped to register 30. Dumping register 20 to register 30 makes it possible for register 20 to immediately begin shifting in more programming data, while the data in register 30 is going in parallel into the programmable registers 40 of device 10 as will now be described.

Each stage of register 30 feeds data to an associated chain of programmable registers 40. For example, register stage 30A feeds the chain of registers that includes stages 40A1a through 40And (where again the letters "d" and "n" are used as index limits which can have any desired values). These register chains may be so-called "first-in-first-out" or "FIFO" chains which progressively fill with data from the bottom (e.g., stage 40And) to the top (e.g., stage 40A1a). In other words, the first programming data bit supplied to a chain from register 30 passes down through all the stages of the chain to be stored in the bottom-most stage. Device 10 then cuts off the bottom-most stage so that the next programming data bit supplied to the chain from register 30 is stored in the next to bottom-most stage of the chain, which is then cut off from the stages-above. This process continues until all the stages of registers 40 have been programmed. More detail regarding this type of FIFO chain programming will be found in above-mentioned Cliff U.S. Pat. No. 5,237,219.

Each stage of each register 40 controls some aspect of the programmable logic 50 of device 10. For example, register stages 40A1a–40A1d control various portions of the programmable logic in logic array block 50A1, while register stages 40A2a–40A2d control various portions of the programmable logic in logic array block 50A2. It will be understood that each of logic array blocks 50 is capable of performing any of several logic functions, depending in part on how it is controlled by the programming signals stored in the associated register 40 stages.

In addition to the elements described above, device 10 typically includes a network of conductors (not shown) for interconnecting logic array blocks 50 with one another and with input and output pins (also not shown) of device 10. An illustrative arrangement of such other elements is shown in Cliff et al. U.S. Pat. No. 5,260,611, which is also hereby incorporated by reference herein.

Figure 2:
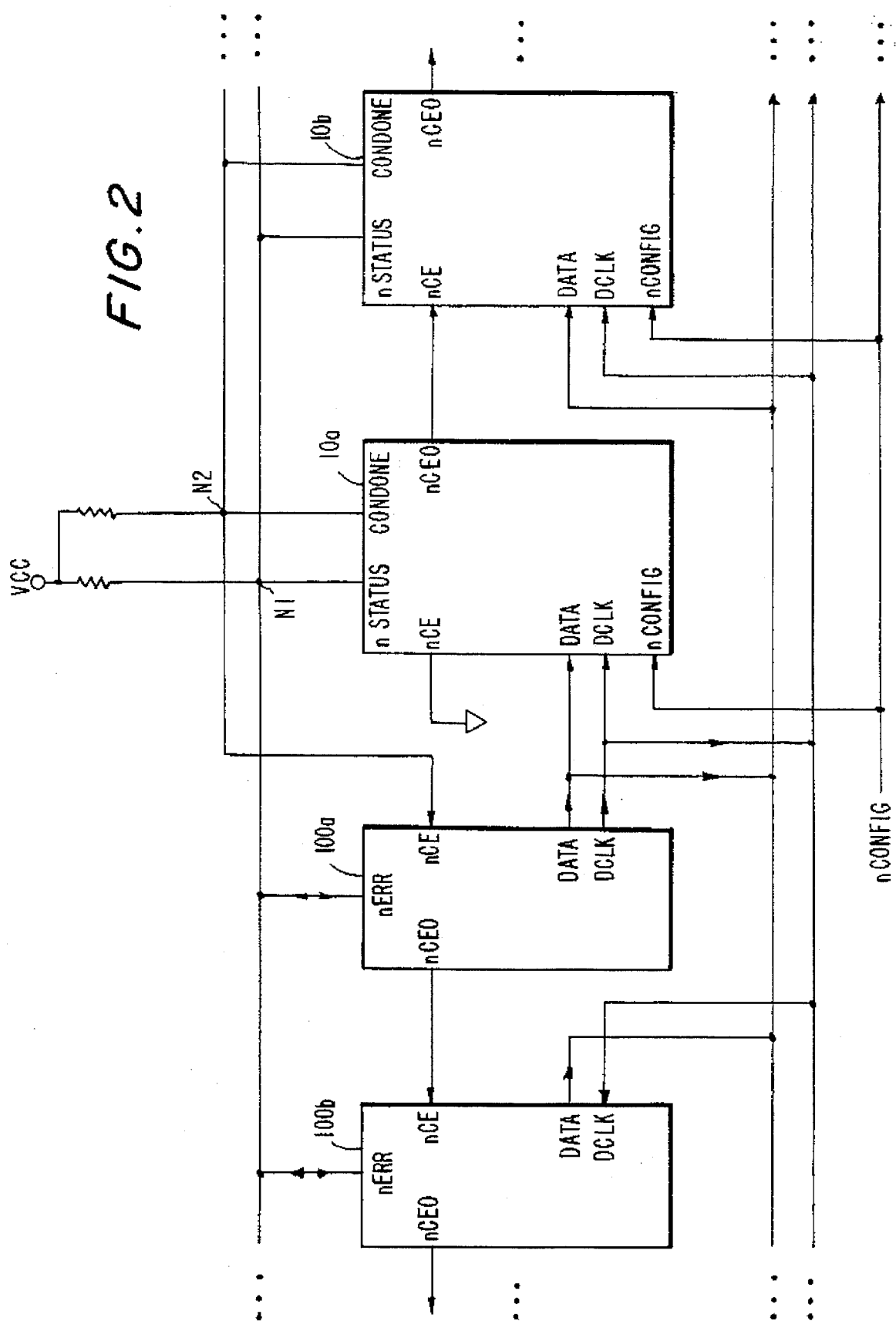
FIG. 2 is a simplified schematic block diagram of a network of logic devices (each of which can be of the type shown in FIG. 1) and programming data and control source devices in accordance with a first illustrative embodiment of this invention.

An illustrative network in accordance with this invention for applying programming data to one or more programmable logic array devices 10a, 10b, etc. (each of which can be like device 10 in FIG. 1) is shown in FIG. 2. Each of devices 10a, 10b, etc. is typically a separate integrated circuit. Each of devices 100a, 100b, etc. is also typically a separate integrated circuit. For example, each of devices 100 may be a serial erasable programmable read only memory ("serial EPROM"). Device 100a is the main device of this kind. Device 100b is an auxiliary device which is included only if device 100a does not have enough capacity to store all the programming data needed to program all of the connected devices 10. As suggested by the dots on the left, additional auxiliary devices 100 may be included if needed to provide still more programming data storage capacity.

When power is first applied to devices 10 and 100, each of those devices pulls down on node N1 via its nSTATUS or nERR terminal until it is ready to operate. When each of devices 100 is no longer pulling down on node N1, each of those devices monitors (via its nERR terminal) the level of the signal at node N1. When all of the devices connected to node N1 are ready to operate and no device is pulling down on that node, the electrical potential of that node rises to VCC. This indicates to devices 100 that programming of devices 10 can begin.

Each of devices 10 also pulls down on node N2 via its CONDONE terminal until that device is fully programmed. As long as node N2 is low, device 100a is enabled to operate via its nCE input terminal. Each of devices 10 can detect when it is fully programmed, for example, by counting the number of DCLK pulses it has received since it was enabled via its nCE input terminal.

The nCONFIG signal is a reset type signal which can be used to initiate a re-programming of devices 10. For example, if programming of devices 10 were controlled by a microprocessor with the ability to select different programming data at different times (e.g., to change the logic functions performed by devices 10), the microprocessor could apply an appropriate nCONFIG signal to devices 10 whenever reprogramming is desired. Among the effects of an nCONFIG request for re-programming of devices 10 is that each of devices 10 again pulls down on node N2 via its CONDONE terminal. This can be used to signal the programming data source that devices 10 are ready to begin receiving new programming data. Other effects of an nCONFIG request for re-programming are (1) readying each device 10 to again begin counting DCLK pulses from a reset starting value, and (2) restoring the nCEO output signal of each device 10 to its initial unprogrammed value.

Device 10a is enabled to accept programming data at all times because its nCE input terminal is tied to ground. Until each device 10 is fully programmed, that device applies to the nCE input terminal of the next device in the series of devices 10 an input signal that prevents the next device from accepting programming data. Devices 10 are therefore programmed one after another in order, beginning with device 10a.

When device 100a is enabled by node N1 being high while node N2 is low, device 100a begins issuing clock signals on its DCLK output lead, as well as issuing programming data bits (synchronized with the DCLK pulses) on its DATA output lead. These data and clock signals are respectively applied to the DATA and DCLK input terminals of all of devices 10. At first, however, only device 10a responds to these signals because only device 10a has a chip enabling signal applied to its nCE input terminal. Thus only device 10a operates as described above in connection with FIG. 1 to take in the programming data and make use of that data for programming itself.

Once device 10a is fully programmed, it cannot respond to any more programming data even though more such data and DCLK pulses may be applied to it. As soon as device 10a is fully programmed, it applies a chip enabling signal to the nCE input terminal of device 10b. This enables device 10b to begin to take in the programming data applied to its DATA input terminal at the DCLK rate. This begins the programming of device 10b. When device 10b is fully programmed, it produces an nCEO output signal suitable for enabling the next device 10 to begin accepting programming data. (The possible presence of such further devices 10 is indicated by the dots extending to the right in FIG. 2.) The process of successively programming devices 10 continues until all of those devices have been fully programmed. Node N2 then rises to VCC, thereby disabling device 100a and any other devices 100 in the network. For example, when thus disabled, device 100a stops issuing DCLK signals and otherwise goes into a state in which it consumes little or no power. (Via the nCEO–nCE connection chain between devices 100, any other device(s) 100 in the network are similarly placed in a low or no power state when node N2 rises to VCC.)

It should be noted that all of devices 10 also monitor (via their CONDONE terminals) the level of the node N2 signal. When node N2 rises to VCC, each of devices 10 responds by preparing to begin normal operation as a logic device. This may include such conventional operations as resetting various clocks and counters, releasing the reset on various registers, and enabling output drivers.

If more data is required to program devices 10 than can be produced by one device 100, then device 100a is supplemented by additional devices such as 100b. As long as device 100a is applying data to the data bus of the network, device 100a applies to the nCE input terminal of device 100b a high signal which disables device 100b. (Each device 100 also applies such a high signal to the adjacent device 100 as long as the signal applied to its nCE input terminal is high.) Device 100b also receives the DCLK output signal of device 100a, but device 100b cannot and does not respond to that signal until it is enabled by a chip enabling signal applied to its nCE input terminal.

When device 100a has applied the last of its data to its DATA output terminal, it changes the state of the signal applied to the nCE terminal of device 100b. This enables device 100b to begin responding to the applied DCLK signal, which device 100a continues to produce at the same rate. Device 100b then begins to output its data via its DATA output terminal at the DCLK rate. The data from device 100b therefore becomes a continuation of the data stream from device 100a and programming of devices 10 accordingly continues on the basis of that data.

If even more programming data is required than can be held by devices 100a and 100b, the series of devices 100 can be extended to as many as are required to hold all the necessary data. Device 100b applies a chip enabling signal to the nCE terminal of the next device 100 after it has output all of its data. The next device 100 is thereby enabled to respond to continued DCLK pulses from device 100a and to begin outputting its data via its DATA output terminal.

It will be apparent from the foregoing that there is no required correlation between the relative sizes of devices 10 and devices 100, although it is preferred for each transition from one device 100 to the next to occur at the end of a "frame" of data. (A "frame" of data is the data required to fill register 20. There may be a small delay in the start-up of each successive device 100. To cope with this, each device 100 initially outputs a few dummy data values (e.g., a series of binary ones) which are ignored by the device 10 being programmed. To facilitate ingnoring such dummy data it preferably occurs between frames of data rather than in the midst of a frame of data. Thus it is preferred that transitions between devices 100 occur between frames of real programming data.) Except for the possible minor constraint explained in the immediately preceding parenthetical, the transitions between deriving programming data from successive devices 100 can occur at any times relative to the transitions between programming successive devices 10. For example, programming data may stop coming from device 100a and start coming from device 100b at the end of a frame of data halfway through the programming of device 10b. The programming networks of this invention are therefore highly modular and flexible with regard to device sizes. Devices 10 of any size(s) can be used with devices 100 of any size(s), again bearing in mind the preference for transitions from one device 100 to the next device 100 at the end of a frame of date.

Figure 3:
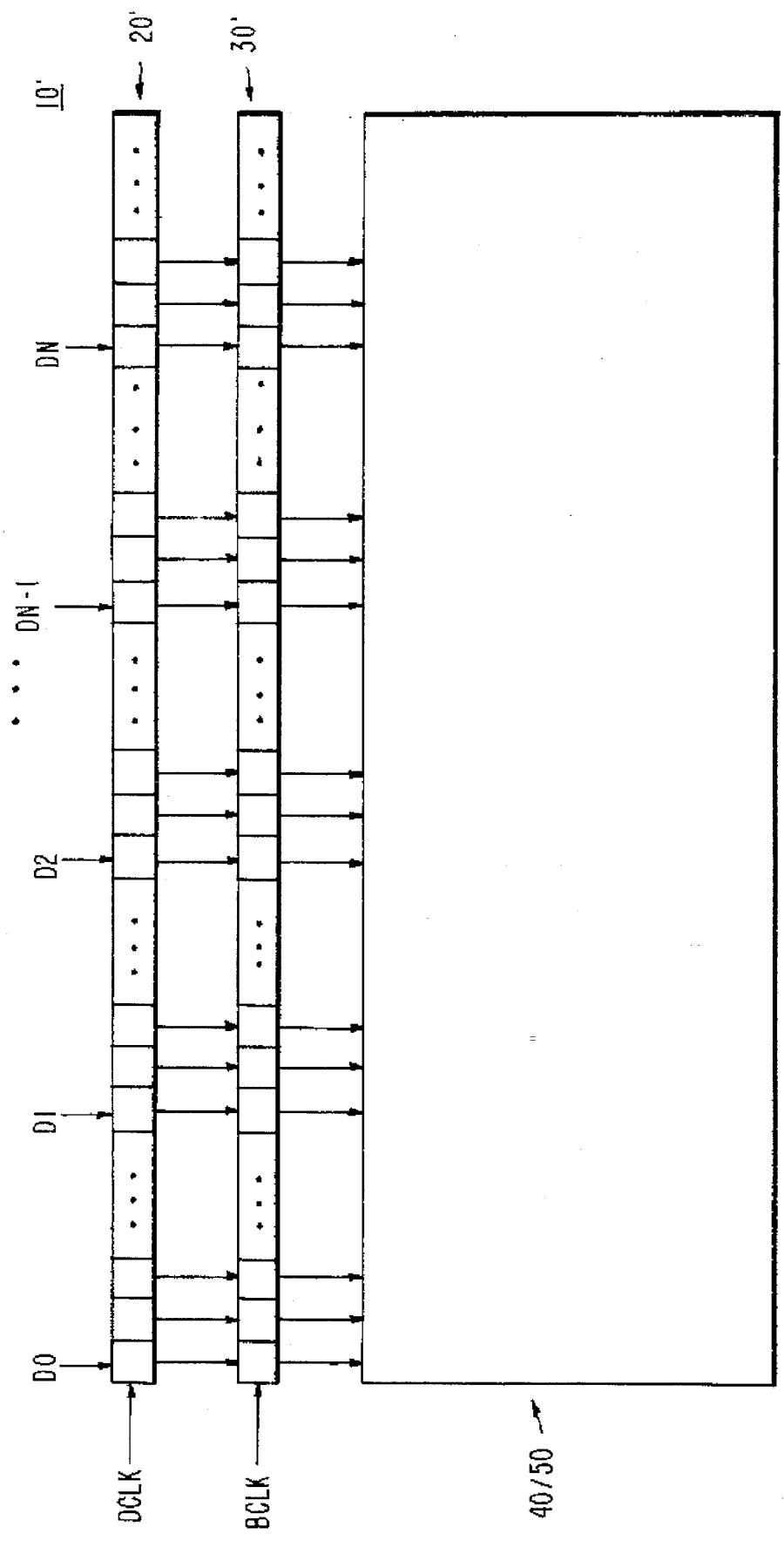
FIG. 3 is a simplified block diagram of portions of an alternative programmable logic device in accordance with this invention.

FIG. 3 shows an alternative embodiment 10' of programmable logic array device 10 which can be programmed more rapidly than device 10. In device 10' shift register 20' has several data input terminals D0 through DN spaced equally along its length. For example, if shift register 20' has 100 stages (from stage 0 at the left to stage 99 at the right), and if N=9, then data input terminal D0 is at stage 0, terminal D1 is at stage 10, terminal D2 is at stage 20, and so on through input terminal D9 at stage 90. Register 20' receives data in parallel at its several data input terminals and shifts that data to the right at the DCLK rate. (Data is not shifted from the left into shift register stages having inputs D0–DN. Thus shift register 20' may alternatively be N+1 separate shift registers, each having a respective one of inputs D0–DN.) Accordingly, the time required to fill register 20' from its several data input terminals is only 1/(N+1) the time required to fill register 20 in FIG. 1 from its single data input terminal. In other respects device 10' can be identical to device 10. Thus each time device 10' detects (e.g., by counting DCLK pulses that have been received) that register 20' contains data that is all new since the last BCLK pulse, device 10' applies a BCLK pulse to register 30. As in device 10, this causes register 30 to accept in parallel all the data contained in register 20'. Register 20' is thereby freed to begin accepting new data via its D0–DN input terminals, while the data in register 30 is used to program the main portion 40/50 of device 10' as described above in connection with FIG. 1.

Figure 4:
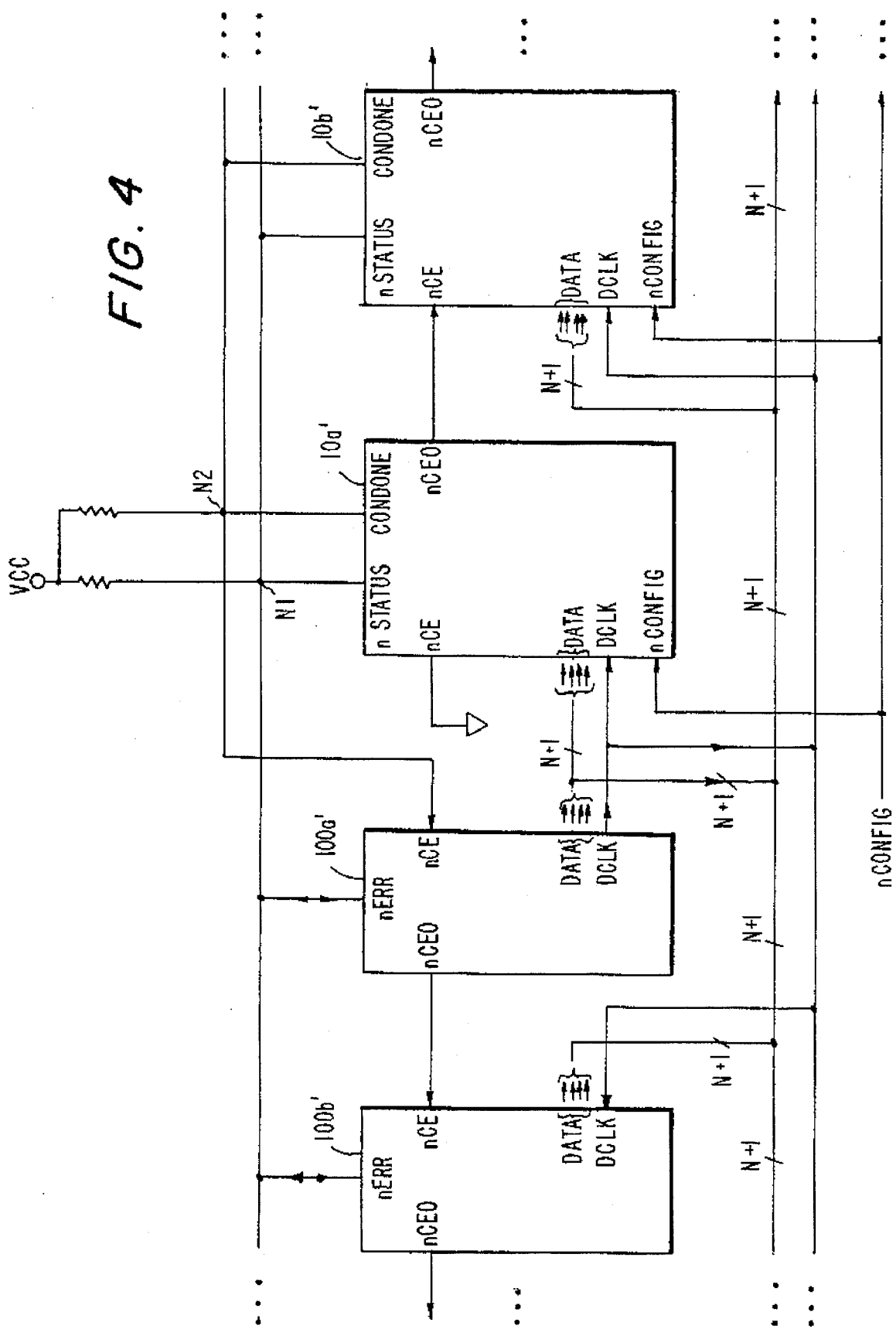
FIG. 4 shows how the network of FIG. 2 can be modified in accordance with this invention to program devices of the type shown in FIG. 3.

FIG. 4 shows how the network of FIG. 2 can be modified for programmable logic array devices 10' of the type shown in FIG. 3. Instead of one data input terminal as in FIG. 2, each device 10a', 10b', etc. in FIG. 4 has N+1 data input terminals. Similarly, each device 100a', 100b', etc. in FIG. 4 has N+1 data output terminals rather than one such terminal as in FIG. 2. (Alternatively, each of devices 100' could be N+1 serial devices arranged in parallel.) Thus one of devices 100' outputs N+1 programming data bits in parallel during each DCLK pulse interval, and one of devices 10' inputs those data bits during that interval. The data bus in FIG. 4 is therefore N+1 conductors wide, rather than being a single conductor as in FIG. 2. In all other respects the network of FIG. 4 may be constructed and may operate exactly as described above in connection with FIG. 2.

Figure 5:
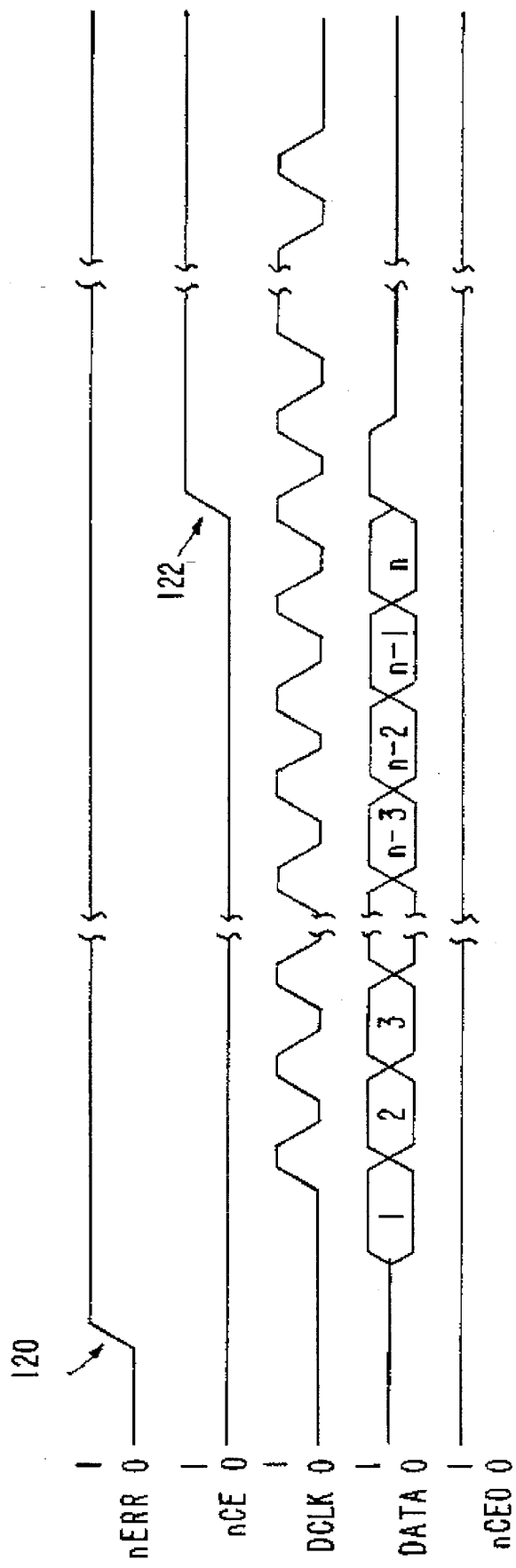
FIG. 5 shows illustrative signals in networks of the types shown in FIGS. 2 and 4.

A typical signal sequence in FIG. 2 or FIG. 4 when only one device 100a or 100a' is needed to program device(s) 10 or 10' is shown in FIG. 5. (The nCE and nCEO signals shown in FIG. 5 are those associated with device 100a or 100a'.) At 120 all of devices 10 and 100a or 10' and 100a' have signalled that they are ready to begin the programming process. The level of the signal at node N1 therefore rises to VCC. Device 100a or 100a' responds by beginning to produce synchronized DCLK and DATA output signals. Each DATA signal pulse in FIG. 1 represents either a bit of data (in the case of networks of the type shown in FIG. 2) or a word of data (in the case of networks of the type shown in FIG. 4).

Assuming that n bits or words of data are required to fully program device(s) 10 or 10' when device 100a or 100a' outputs the last bit or word, device(s) 10 or 10' detect that they are filled and allow the signal at node N2 to rise to VCC as shown at 122 in FIG. 5. Device 100a or 100a' then produces a few more (e.g., 16) DCLK pulses. If no error conditions are detected during those further DCLK pulses, the programming process has been completed successfully and device 100a or 100a' switches to the low or no power mode described above. (Examples of error conditions are discussed below in connection with FIGS. 7 and 8.)

Figure 6:
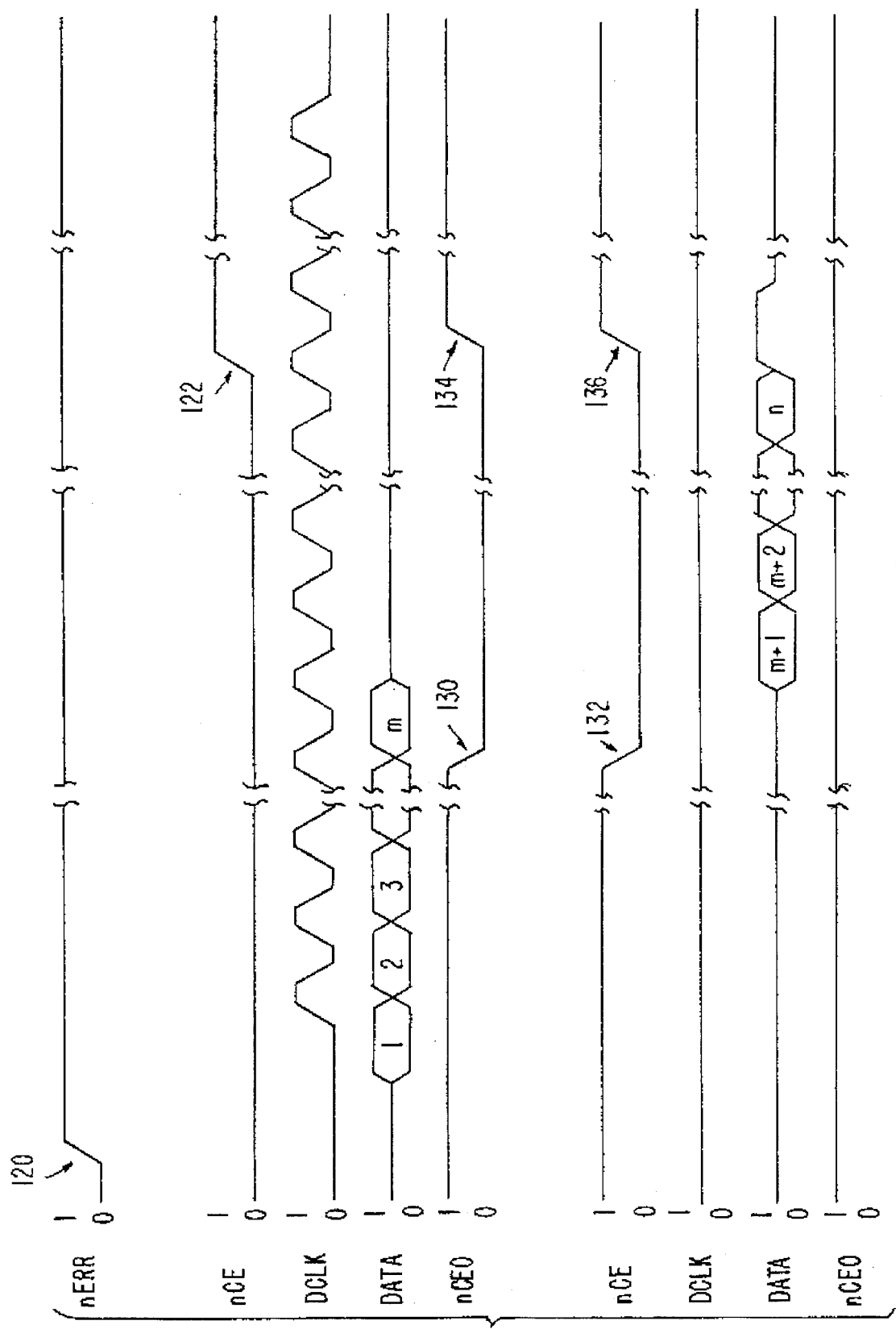
FIG. 6 shows other illustrative signals in networks of the types shown in FIGS. 2 and 4.

FIG. 6 illustrates a typical signalling sequence in FIG. 2 or FIG. 4 when two or more devices 100 or 100' are required to produce the data needed to program the device(s) 10 or 10' in the network. In FIG. 6 the upper signals nCE, DCLK, DATA, and nCEO are associated with device 100a or 100a' while the lower signals nCE, DCLK, DATA, and nCEO are associated with device 100b or 100b'. FIG. 6 assumes that all of the devices 100 or 100' in a network are constructed identically, for example, with the capability of producing a DCLK signal. As described above, however, only the main device 100a or 100a' actually produces the DCLK signal.

Considering FIG. 6 now in more detail, transition 120 is identical to transition 120 in FIG. 5. Immediately after transition 120, each device 100 or 100' detects whether it is the main device of that type or an auxiliary device of that type. This determination can be made on the basis of the level of the applied nCE signal when transition 120 occurs. The device 100 or 100' with the low nCE signal at transition 120 is the main device 100a or 100a'. Devices 100 or 100' with a high nCE signal at transition 120 are auxiliary devices like 100b or 100b'. Thus in FIG. 6 the device 100a or 100a' associated with the upper signals nCE, DCLK, DATA, and nCEO determines that it is the master device and begins producing synchronized DCLK and DATA pulses shortly after transition 120 as described above in connection with FIG. 5.

When device 100a or 100a' is about to produce its last bit (FIG. 2) or word (FIG. 4) of data $\underline{m}$, device 100a or 100a' causes its nCEO output signal to transition from high to low as shown at 130. This causes a similar transition 132 in the nCE input signal of first auxiliary device 100b or 100b'. Device 100a or 100a' then produces its final data output $\underline{m}$ and thereafter stops producing data. However, device 100a or 100a' continues to produce DCLK output pulses, and device 100b or 100b' begins to respond to those pulses by producing DATA signals m+1, m+2, etc. in synchronism with the DCLK pulses from device 100a or 100a'.

After device 100b or 100b' has produced its last data $\underline{n}$, the device(s) 10 or 10' in the network signal a full condition by allowing the nCE signal applied to device 100a or 100a' to rise to VCC as shown at 122. This causes device 100a or 100a' to raise its nCEO output signal to VCC as shown at 134, which similarly raises the nCE input signal of device 100b or 100b' to VCC as shown at 136. Device 100b or 100b' is thereby placed in a low or no power mode, and after a predetermined number of further clock pulses from device 100a or 100a' that device also enters a low or no power mode.

Figure 7:
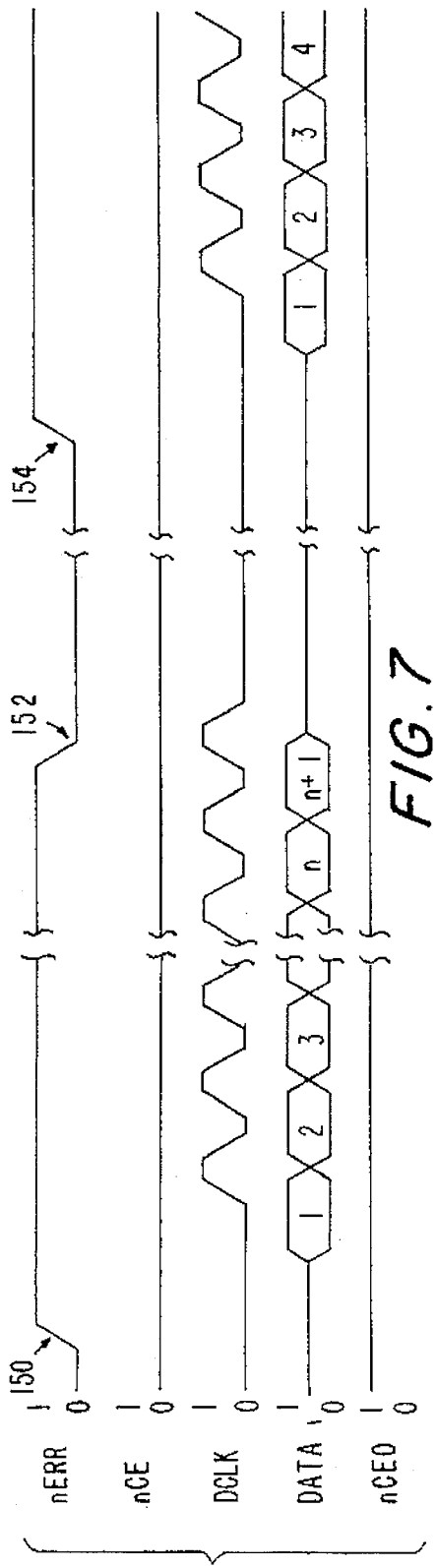
FIG. 7 shows more illustrative signals in networks of the types shown in FIGS. 2 and 4.

If desired, the apparatus shown in FIGS. 1–4 may include various types of programming error detection signalling. For example, FIG. 7 shows any of devices 10 or 10' using the level of the signal at node N1 to indicate that it has detected a programming error. Devices 100 or 100' respond to such an indication by stopping and restarting the programming operation.

With more detailed reference to FIG. 7, at 150 (similar to 120 in FIG. 5 or FIG. 6) the signal at node N1 (FIG. 2 or FIG. 4) goes high, indicating that all of devices 10 and 100 or 10' and 100' are ready for programming to begin. The nCE signal is also low, indicating that devices 10 or 10' are as yet unprogrammed. Shortly after transition 150, device 100 or 100' begins to output synchronized DCLK and DATA signals. The successive bits (FIG. 2) or words (FIG. 4) of DATA are numbered 1, 2, 3, ... n, n+1, etc. in FIG. 7. At time 152 one of devices 10 or 10' detects that it has not received correct programming data or that something else has gone wrong with the programming process. That device 10 or 10' therefore uses its nSTATUS terminal to lower the level of the signal at node N1. This is detected by devices 100 or 100' via their nERR terminals. Devices 100 or 100' therefore shortly thereafter cease outputting DCLK and DATA signals and reset themselves to prepare to restart the programming process. All of devices 10 or 10' also detect that the level of the signal at node N1 has been pulled down. Devices 10 or 10' therefore also all reset themselves to prepare for the restarting of the programming process.

After a suitable time-out interval, the device 10 or 10' that detected the programming error and caused transition 152 allows the nSTATUS/nERR signal to again rise to VCC as shown at 154. Transition 154 is like transition 150, and so shortly thereafter device 100 or 100' again begins outputting synchronized DCLK and DATA signals, beginning again with the programming data at the start of the programming data sequence.

Figure 8:
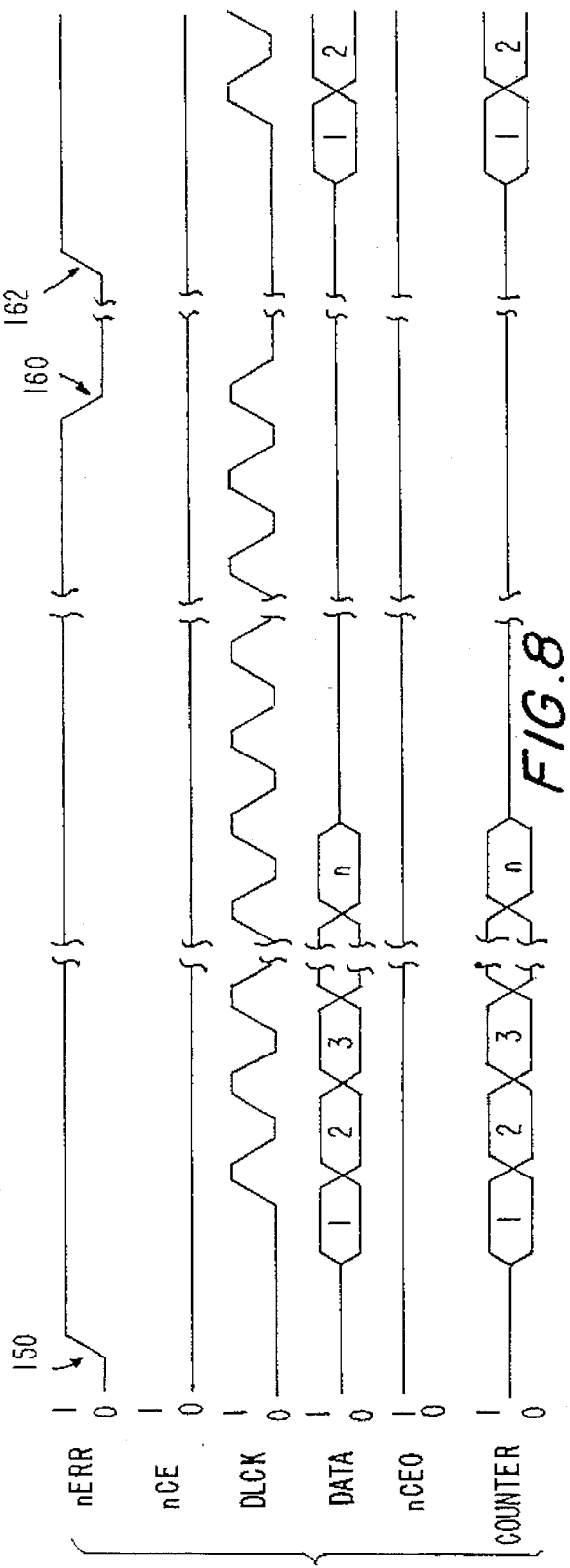
FIG. 8 shows still more illustrative signals in networks of the types shown in FIGS. 2 and 4.

Another example of programming error detection signalling that may be used in systems of the type shown in FIGS. 2 or 4 is illustrated by FIG. 8. The first portion of FIG. 8 is identical to FIG. 7, except that FIG. 8 additionally shows a counter which is preferably located on device 100a or 100a' for counting the number of data bits (FIG. 2) or words (FIG. 4) that have been output by devices 100 or 100'. Assuming that the entire program consists of $\underline{e}$ bits or words, when that amount of data has been output, the counter reaches a count of $\underline{n}$ and devices 100 or 100' stop outputting data. Device 100a or 100a' then waits a predetermined number of DCLK cycles for the signal at node N2 to rise to VCC. As described above, devices 10 or 10' should allow this to happen when each of those devices recognizes that it is fully programmed. However, if for any reason one of devices 10 or 10' has not been fully programmed, it does not allow the level of the signal at node N2 to rise to VCC. If the above-mentioned predetermined number of DCLK cycles passes without the signal at node N2 rising to VCC, this is detected by device 100a or 100a' via that device's nCE terminal. Device 100a or 100a' then knows that one of devices 10 or 10' was not fully programmed and that the programming process should be repeated. Device 100a or 100a' therefore pulls down the signal at node N1 as shown at 160. This resets all of devices 10 and 100 or 10' and 100'. After a predetermined time-out interval, device 100a or 100a' allows the signal to transition back to VCC as shown at 162, which restarts the programming process as at transition 150.

Figure 9:
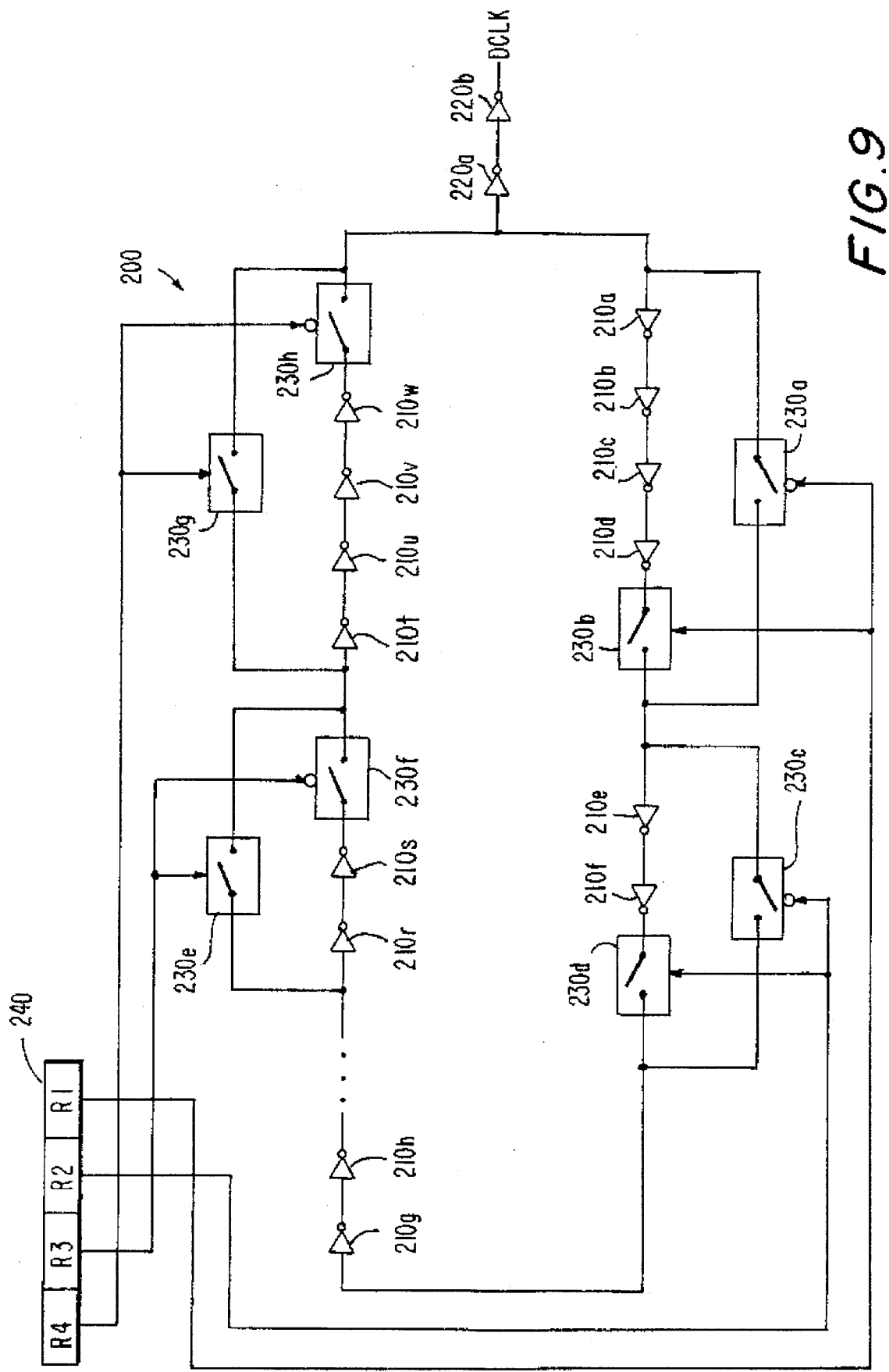
FIG. 9 is a simplified schematic block diagram of a circuit which can be used on one of the programming devices in FIG. 2 or FIG. 4 in accordance with this invention.

In order to facilitate programming of programmable logic array devices 10 or 10' having different speed capabilities, device 100a or 100a' may include a DCLK circuit having a programmably adjustable clock rate. An illustrative embodiment 200 of such a circuit is shown in FIG. 9. A signal pulse propagates repeatedly around the closed loop made up of inverters 210a–210w, although it will be understood that the number of inverters in this loop is arbitrary and that some of the inverters may sometimes be switched out of use as will be more fully explained below. The loop of inverters 210 is tapped at one location by inverters 220 to produce the DCLK output signal. The clock rate of the DCLK signal is determined by the time required for a signal to propagate all the way around the inverter loop.

In order to adjust the DCLK rate, several groups of inverters 210 can be short-circuited to effectively remove them from the inverter loop. For example, inverters 210a–210d can be short-circuited by closing switch 230a. Switch 230b is opened whenever switch 230a is closed to avoid having more than one path around the inverter loop at any one time. Similarly, inverters 210e and 210f can be short-circuited by closing switch 230c and opening switch 230d. Inverters 210r and 210s can be short-circuited by closing switch 230e and opening switch 230f. Inverters 210t–210w can be short-circuited by closing switch 230g and opening switch 230h. A programmable register 240 on device 100a or 100a' controls the status of switches 230. Stage R1 of register 240 controls the status of switches 230a and 230b in complementary fashion. Stage R2 of register 240 similarly controls the status of switches 230c and 230d. Stage R3 of register 240 controls the status of switches 230e and 230f. And stage R4 of register 240 controls the status of switches 230g and 230h.

From the foregoing, it will be apparent that the clock rate of the DCLK signal can be adjusted by appropriately programming register 240. For example, if the "normal" clock rate is the result of having inverters 210a–210f in the circuit, but having inverters 210r–210w short-circuited, the following table indicates how the clock rate can be increased (fewer inverter delays) or decreased (more inverter delays) from the normal rate:

TABLE I

| Clock Rate (Number of Inverter Delays Minus or Plus from Normal) | Open Switches 230 | Closed Switches 230 | Register 240 Data |
|---|---|---|---|
| −6 (faster clock rate) | b,d,f,h | a,c,e,g | 0011 |
| −4 | b,c,f,h | a,d,e,g | 0111 |
| −2 | a,d,f,h | b,c,e,g | 1011 |
| normal | a,c,f,h | b,d,e,g | 1111 |
| +2 | a,c,e,h | b,d,f,g | 1101 |
| +4 | a,c,f,g | b,d,e,h | 1110 |
| +6 (slower clock rate) | a,c,e,g | b,d,f,h | 1100 |

Device 100a or 100a' can be programmed via register 240 to produce a slower DCLK rate when the programmable logic array devices 10 or 10' being programmed are relatively slow. Device 100a or 100a' can be programmed to produce a faster DCLK rate when the programmable logic array devices 10 or 10' being programmed are relatively fast. This facilitates providing one type of device 100a or 100a' that is suitable for programming a wide range of devices 10 or 10'.

Figure 10:
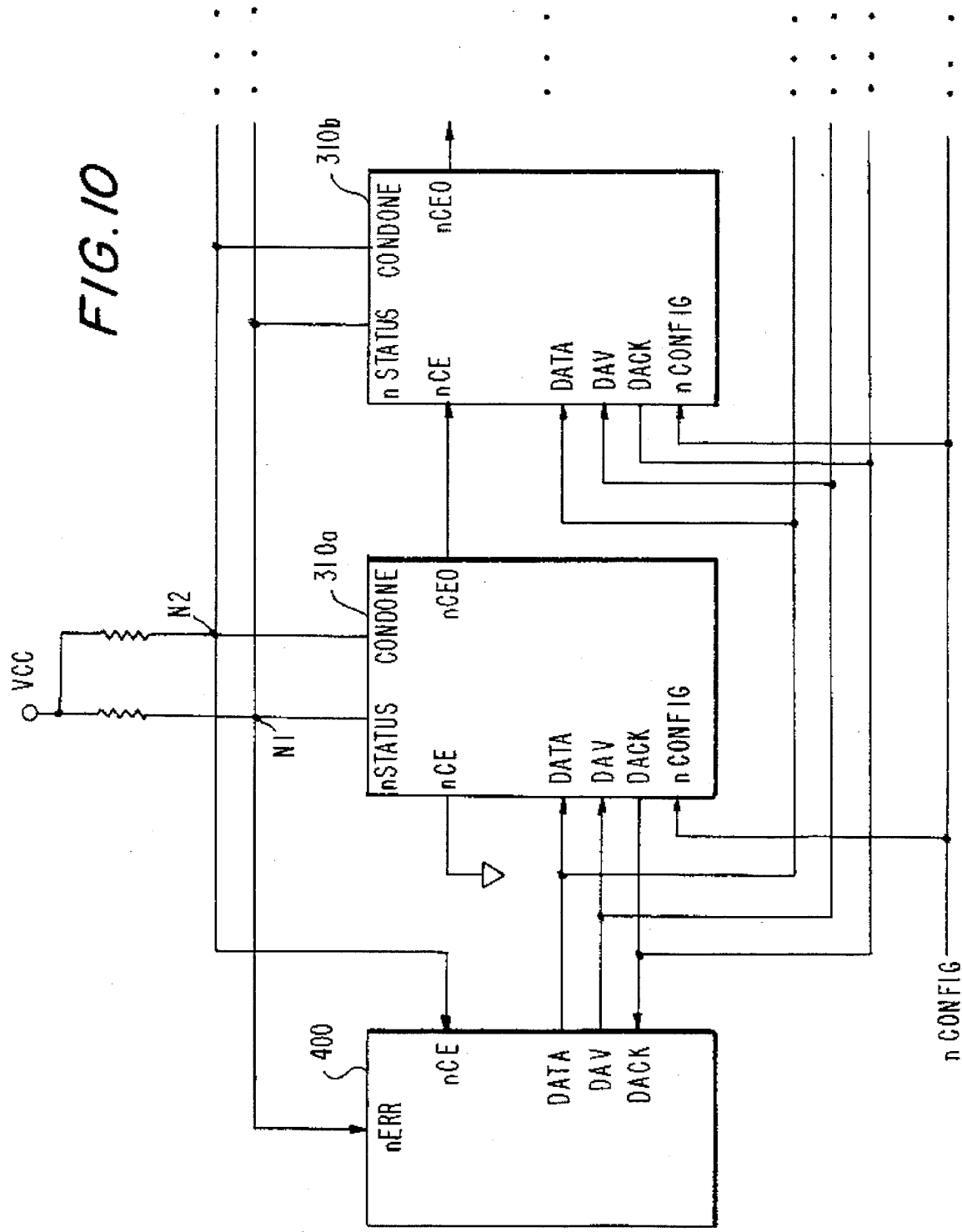
FIG. 10 is a simplified schematic block diagram similar to FIG. 2 or FIG. 4 showing an alternate signalling scheme for programming data in accordance with this invention.
Figure 11:
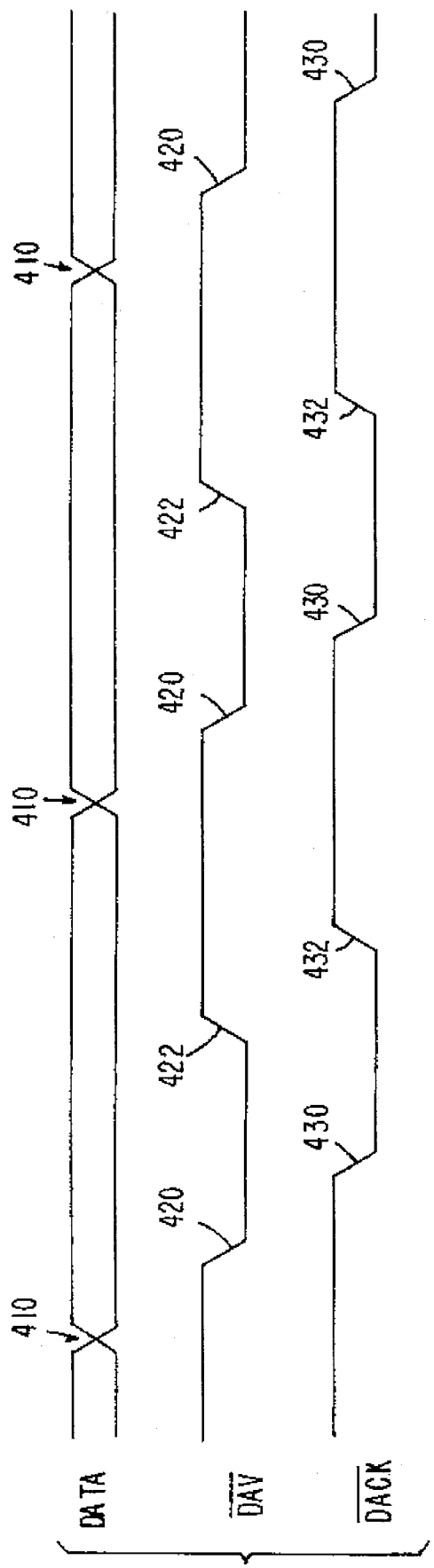
FIG. 11 shows illustrative signals in networks of the type shown in FIG. 10.

FIGS. 10 and 11 show another type of programming signalling that can be used in accordance with this invention if desired. In FIG. 10 each of devices 310a, 310b, etc., can be similar to a device 10 in FIG. 2 or a device 10' in FIG. 4. Device 400 can be similar to device 100a in FIG. 2 or device 100a' in FIG. 4. Instead of producing a DCLK signal, however, device 400 produces a data available ("DAV") signal transition 420 a short time after each possible transition 410 in the programming DATA signal. The DAV output signal of device 400 is applied to the DAV input terminal of each of devices 310. A short time after receiving each DAV signal transition 420, the device 310 currently being programmed shifts in the DATA signal currently being applied to its DATA input terminal. Then the device 310 currently being programmed produces a data acknowledge ("DACK") signal transition 430 to acknowledge that it has received the DATA signal. The DACK signal is applied to device 400. After receiving each DACK signal transition 430, device 400 causes the DAV signal to transition (as at 422) back to its original condition. The device 310 currently being programmed detects each DAV signal transition 422 and responds shortly thereafter by causing the DACK signal to transition (as at 432) back to its original condition. Device 400 detects each DACK signal transition 432 and shortly thereafter (at 410) begins to output the next DATA signal pulse. This begins the next sequence of DAV and DACK signal transitions 420, 430, 422, and 432.

An advantage of the signalling scheme illustrated by FIGS. 10 and 11 is that the programming data source device 400 automatically adjusts to whatever speed the device currently being programmed is capable of receiving programming data at. Without this type of signalling scheme, programming device 400 must be set to send out data no faster than the slowest device 310 that may need to be programmed. If, as is often the case, different devices 310 may be able to accept programming data at different speeds, this will mean that device 400 will have to be set to operate more slowly than many devices 310 are capable of having it operate. The result will be slower average programming time. By using the signalling technique illustrated by FIGS. 10 and 11, each device 310 is automatically programmed at whatever speed it can accept data. This will shorten programming time for many devices 310.

Except as described above, the apparatus of FIG. 10 may be constructed and operate as previously described in connection with FIG. 2 or FIG. 4. Thus the DATA bus in FIG. 10 may be either a single lead (as in FIG. 2) or several parallel leads (as in FIG. 4).

It will be understood that the foregoing is only illustrative of the principles of this invention, and that various modifications can be made by those skilled in the art without departing from the scope and spirit of the invention. For example, logic devices 10 and 10' can have other, conventional, internal organizations of their programming and logic circuitry (e.g., elements 40 and 50 in FIG. 1). As another example of modifications within the scope of the invention, a microprocessor can be used in place of devices 100 or 100' in networks of the type shown in FIGS. 2 and 4.

The invention claimed is:

1. Apparatus for programming a plurality of programmable, integrated circuit, logic array devices arranged in an ordered sequence comprising:

a source of serial programming data synchronized with a programming clock signal which is also provided by said source, said source being external to all of said logic array devices;

a data bus for applying said serial programming data to all of said logic array devices in parallel;

a clock bus for applying said clock signal to all of said logic array devices in parallel; and a chip enable connection from each of said logic array devices to the next of said logic array devices in said ordered sequence, each of said logic array devices applying a chip enable signal to the chip enable connection to the next of said logic array devices only after said logic array device applying said chip enable signal has been fully programmed by said serial programming data, and each of said logic array devices being enabled for programming by said serial programming data by receipt of said chip enable signal from the preceding logic array device in said ordered sequence.

2. The apparatus defined in claim 1 wherein said source comprises a plurality of programming data memory devices arranged in an ordered series, each of said memory devices being capable of serially outputting, in synchronism with said clock signal, programming data stored in said memory device, each of said memory devices outputting its programming data via a data output terminal of said memory device, wherein said data bus is connected to said data output terminals of all of said memory devices, wherein said clock bus is connected to all of said memory devices, and wherein said source further comprises a device enable connection from each of said memory devices to the next of said memory devices in said ordered series, each of said memory devices applying a device enable signal to the device enable connection to the next of said memory devices only after said memory device applying said device enable signal has output all of its programming data, and each of said memory devices being enabled to output its programming data by receipt of said device enable signal from the preceding memory device in said ordered sequence.

3. The apparatus defined in claim 1 wherein said serial programming data comprises a plurality of parallel data streams, and wherein said data bus comprises a plurality of parallel conductors, each of said conductors carrying a respective one of said data streams.

4. The apparatus defined in claim 1 wherein said data bus is external to said logic array devices.

5. The apparatus defined in claim 1 wherein said clock bus is external to said logic array devices.

6. The apparatus defined in claim 1 wherein each of said logic array devices has a control output terminal for producing a control output signal when said logic array device is fully programmed, and wherein said source switches to a low power mode in response to said control output signal being output by all of said logic array devices.

7. The apparatus defined in claim 1 wherein each of said logic array devices has a control output terminal for producing a control output signal indicating when said logic array device is ready to begin receiving programming data, and wherein said source begins to output said programming data in response to said control output signal being output by all of said logic array devices.

8. The apparatus defined in claim 7 wherein said source has an input terminal for monitoring the absence of said control output signal from any of said logic array devices and for resetting said source in response to said absence so that said source will begin to output said programming data when all of said logic array devices are outputting said control output signal.

9. A programmable logic array integrated circuit device comprising:

a plurality of shift registers, each of which has a plurality of stages arranged in an ordered sequence;

a plurality of programming data input terminals, each of said terminals being connected to a first stage of a respective one of said shift registers, and each of said shift registers shifting programming data from its first stage through all of its stages in said ordered sequence;

a buffer register having a plurality of stages, each stage of said buffer register being connected to a respective one of said shift register stages, said buffer register receiving programming data in parallel from all of said shift register stages; and programming registers for receiving said programming data from said buffer register and for storing said programming data in order to program said logic array devices.

10. The apparatus defined in claim 9 further comprising:

a source of programming data external to said logic array device, said source providing said programming data in a plurality of parallel streams of serial data synchronized with a clock signal which is also provided by said source, each of said streams being connected to a respective one of said programming data input terminals, and all of said shift registers shifting in synchronism with said clock signal.

11. The apparatus defined in claim 10 wherein said logic array device is one of a plurality of such devices arranged in an ordered series, wherein each of said streams is connected in parallel to a respective one of said programming data input terminals of each of said logic array devices, wherein said clock signal is applied in parallel to all of said logic array devices, and wherein each of said logic array devices has an output terminal for producing an output signal which enables the next logic array device in said ordered series to begin responding to said programming data when the logic array device producing said output signal is fully programmed.

12. The apparatus defined in claim 11 wherein said source comprises a plurality of programming data memory devices arranged in an ordered sequence, each of said memory devices being capable of serially outputting a plurality of parallel streams of serial programming data synchronized with said clock signal, each of said streams from each of said memory devices being connected in parallel with a respective one of said streams from each of the other memory devices to produce a respective one of said streams from said source, and each of said memory devices having a control output terminal for producing a control output signal which enables the next memory device in said ordered series to begin outputting its programming data when the memory device producing said control output signal has output all of its programming data.

13. The apparatus defined in claim 12 wherein said streams are conveyed in parallel from each of said memory devices to each of said logic array devices by data bus conductors that are external to all of said memory devices and all of said logic array devices.

14. The apparatus defined in claim 13 wherein said clock signal is conveyed in parallel to all of said logic array devices by a clock bus conductor that is external to all of said memory devices.

* * * * *